(12) United States Patent
Letowski et al.

(10) Patent No.: US 10,840,110 B2
(45) Date of Patent: Nov. 17, 2020

(54) PROCESS FOR FABRICATING A HETEROSTRUCTURE COMPRISING A CONDUCTIVE STRUCTURE AND A SEMICONDUCTOR STRUCTURE AND INCLUDING A STEP OF ELECTRICAL DISCHARGE MACHINING

(71) Applicant: COMMISSARIAT A L'ENERGIE ATOMIQUE ET AUX ENERGIES ALTERNATIVES, Paris (FR)

(72) Inventors: Bastien Letowski, Vallouise (FR); Julie Widiez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/345,145

(22) PCT Filed: Oct. 24, 2017

(86) PCT No.: PCT/EP2017/077069
§ 371 (c)(1),
(2) Date: Apr. 25, 2019

(87) PCT Pub. No.: WO2018/077831
PCT Pub. Date: May 3, 2018

(65) Prior Publication Data
US 2019/0287817 A1    Sep. 19, 2019

(30) Foreign Application Priority Data

Oct. 26, 2016 (FR) ...................... 16 60368

(51) Int. Cl.
*H01L 21/48* (2006.01)
*H01L 23/492* (2006.01)
(Continued)

(52) U.S. Cl.
CPC ........ *H01L 21/4878* (2013.01); *H01L 21/306* (2013.01); *H01L 23/492* (2013.01); *H01L 31/18* (2013.01)

(58) Field of Classification Search
CPC ... H01L 21/4878; H01L 31/18; H01L 21/306; H01L 23/492
See application file for complete search history.

(56) References Cited

FOREIGN PATENT DOCUMENTS

FR    3 028 095 A1    5/2016

OTHER PUBLICATIONS

Egashira, et al., "Micro-drilling of monocrystalline silicon using a cutting tool", Precis. Eng., vol. 26, No. 3, pp. 263-268, Jul. 2002.
(Continued)

*Primary Examiner* — Karen Kusumakar
(74) *Attorney, Agent, or Firm* — BakerHostetler

(57) ABSTRACT

A process for fabricating at least one elementary heterostructure includes producing a heterostructure comprising at least one semiconductor structure of resistivity higher than or equal to 1 Ω.cm located between two electrically conductive structures of resistivity lower than or equal to 0.1 Ω.cm; cutting the heterostructure by electrical discharge machining so as to define at least the elementary heterostructure; the thickness of the semiconductor structure being smaller than about 1/10th of the thickness of at least one of the electrically conductive structures or of the total thickness of the electrically conductive structures.

16 Claims, 5 Drawing Sheets

(51) Int. Cl.
    *H01L 21/306*    (2006.01)
    *H01L 31/18*     (2006.01)

(56)  References Cited

OTHER PUBLICATIONS

Mohri et al., "Assisting Electrode Method for Machining Insulating Ceramics", Annals of the CIRP, vol. 45, No. 1, pp. 201-204, 1996.

Masaki, et al., "Micro Electro-Discharge Machining and its applications", IEEE Proceedings on Micro Electro Mechanical Systems, An Investigation of Micro Structures, Sensors, Actuators, Machines and Robots, 1990.

Luo, et al., "Investigation of silicon wafering by wire EDM", Journal of Materials Science, vol. 27, No. 21, pp. 5805-5810, 1992.

Reynaerts, et al. "Microstructuring of silicon electro-discharge machining (EDM) part I: theory", Elsevier Sciences, vol. 60, Nos. 1-3, pp. 212-218, (1997).

Girardin, "Développement d'un procédé d'usinage parmicro-électroérosion", Université Claude Bernard—Lyon I, 2012.

Saleh, et al., "Experimental study on improving μ-WEDM and μ-EDM of doped silicon by temporary metallic coating", The International Journal of Advanced Manufacturing Technology, vol. 78, Issue 9-12, pp. 1651-1663, Jan. 13, 2015.

Kunieda, et al., "Improvement of EDM efficiency of silicon single crystal through ohmic contact", Precision Engineering, vol. 24, Issue 3, pp. 185-190, Jul. 1, 2000.

Lee, et al., "Effect of metal coating on machinability of high purity germanium using wire electrical discharge machining", Journal of Materials Processing Technology, vol. 213, Issue 6, pp. 811-817, Jan. 3, 2013.

Bamberg, et al., "Experimental investigation of wire electrical discharge machining of gallium-doped germanium", Journal of Materials Processing Technology, vol. 197, Issues 1-3, pp. 419-427, Dec. 14, 2007.

FIG. 1 --Prior Art--

--Prior Art--

PROCESS FOR FABRICATING A HETEROSTRUCTURE COMPRISING A CONDUCTIVE STRUCTURE AND A SEMICONDUCTOR STRUCTURE AND INCLUDING A STEP OF ELECTRICAL DISCHARGE MACHINING

CROSS-REFERENCE TO RELATED APPLICATIONS

This application is a National Stage of International patent application PCT/EP2017/077069, filed on Oct. 24, 2017, which claims priority to foreign French patent application No. FR 1660368, filed on Oct. 26, 2016, the disclosures of which are incorporated by reference in their entirety.

FIELD OF THE INVENTION

The field of the invention is that of the fabrication of devices or component packages comprising heterostructures incorporating structures made from ductile materials and structures made from fragile materials.

BACKGROUND

Generally, a material is considered to be fragile if it breaks without warning and abruptly. Its stress-strain curve remains linear up to breakage at which point all the stored elastic energy is freed in a single go. In contrast, a material is said to be ductile if it absorbs most energy in the form of plastic deformations.

In very diverse applications such as microelectronics, power electronics or even photovoltaics, etc., and more particularly during the microfabrication and packaging of components, it is common to associate semiconductors (fragile materials) and metals (ductile materials) (in interconnects for example). However, this association becomes a problem during cutting. Specifically, it is not straightforward to cut a heterostructure consisting of a stack containing a fragile material and a ductile material that have different properties.

This problem is in particular encountered in the context of power electronic devices comprising vertical 3D switching cells such as described in the patent application filed by the Applicant and published under the No. 3028095.

To package 3D power components, a plurality of materials are associated in this type of power electronic device comprising vertical 3D switching cells. In this context, thick layers of metal (such as of copper) are used for electrical interconnection and thermal conduction (cooling) of power components made from silicon. The thing termed "heterostructure" here corresponds to the Si/Cu/Si sandwich or even to the Cu/Si/Cu/Si/Cu sandwich. More precisely, as described in the aforementioned patent application, it is necessary to cut switching cells formed beforehand by assembling plate-to-wafer metal substrates and the semiconductor substrates in which components are produced, the metal substrates possibly typically having thicknesses of about several hundred microns. Assemblies of switching cells placed side-by-side are isolated after cutting.

The cutting problem was presented above in a precise context, namely that of sandwich-type power packages, but it may be present in various contexts, such as that of a solar cell joined to a metal substrate or of any other active or inactive component/layer used in the production of multilayer substrates containing at least one ductile layer (metal layer for example made of copper, aluminum, gold, silver).

The standard cutting process used in microelectronics is sawing. This technique is well suited to fragile materials (such as semiconductors or ceramics) but reaches its limits with ductile materials (such as copper, aluminum or even plastic) with substantial burrs, chipping and often cutting conditions that are very specific and not compatible with the semiconductor, leading to:

the use of oil-based lubricants;
low rotation speeds in order to limit heating of the metal;
cutting advance speeds that are much lower than with a semiconductor alone.

In parallel, to machine conductive substrates, it is known to use electrical discharge machining (EDM), which is a technique for cutting metals that is widely used for example in precision machining to manufacture injectors for combustion engines. This technique consists in creating a series of electrical discharges (or sparks) in the space between a tool-electrode and the part to be machined, which are both submerged in a liquid dielectric. This inter-electrode space is referred to as a "gap". Technologically, the roughness of the sidewalls is controlled by the current of the electric arc. This technique is characterized by its ability to machine any electrically conductive material (metals, alloys, carbides, graphite, etc.) whatever their hardness. It is conventional to make a plurality of passes each with a decreasing current in order to gradually decrease the roughness of the cut sidewalls. The thesis by G. Girardin, "*Développement d'un procédé d'usinage par micro-électroérosion*," [Development of a micro-EDM process] PhD thesis, Université Claude Bernard—Lyon I, 2012, describes this technology in detail. FIG. 1 in particular illustrates the principle behind the EDM of a part with a tool. The part is submerged in a bath, the conductive part is raised to one potential, and the tool is raised to another potential so as to create an electric arc. The tool-electrode may advantageously be a metal wire allowing parts of very small size to be cut.

This technique may also be applied to the cutting of semiconductors such as silicon but with a resistivity constraint. The semiconductor is doped so as to be made conductive. This technique is also used in microfabrication to machine and drill micro-holes for the production of MEMS: K. Egashira and K. Mizutani, "Micro-drilling of monocrystalline silicon using a cutting tool," *Precis. Eng.*, vol. 26, no. 3, pp. 263-268, July 2002.

EDM also creates flexibility in the geometries to be cut. Standard saw-based cutting tolerates only cuts on either side of a substrate or a wafer and does not allow rounded shapes to be achieved. EDM cutting may be used to cut any type of shape, even rounded shapes, and may for example be used to cut circular wafers or substrates from a wafer of larger diameter.

It will be noted that the cutting wire used in EDM is not necessarily perpendicular to the surface to be machined and it is possible to make use of this angle so that a chamfer angle is obtained following cutting, this being an advantageous way of producing a bevel on the edge of a substrate.

Even though the EDM technique is characterized by its ability to machine any electrically conductive material (metals, alloys, carbides, graphite, etc.) whatever their hardness, methods for machining resistive materials (ceramics) have also been developed, such as described in the article by N. Mohri et al. "Assisting Electrode Method for Machining Insulating Ceramics", Annals of the CIRP, vol. 45/1/1996. Specifically, in order to be able to produce shapes, by machining, in ceramic parts, the authors of this publication show that by adding an assisting electrode, as shown in FIG. 2 of this article, and therefore a conductive metallic material on the non-conductive ceramic, it is possible to produce the desired shapes on the surface of this ceramic. Specifically, as shown in FIG. 10 of this article, the assisting electrode melts and allows the ceramic to be machined by thermal conduction. However, it is not a question of cutting in this article, since the current does not pass through the ceramic.

In this context, the Applicant proposes in the context of the present invention, an approach that makes it possible to cut heterostructures comprising both thick electrically conductive structures, such as thick metal layers, which present drawbacks with respect to standard saw-based cutting, and semiconductor structures of a high resistivity, typically higher the 1 Ω.cm, and therefore of a resistivity such that, a priori, it is not possible to cut said structures by EDM, without adjusting the polarity of the surface or depositing metal on the surface.

EDM processes (made possible by means of surface metal deposits) for cutting Si of resistivity of as high as 15 ohm.cm have already been described: Takeshi Wasaki, et al. "Micro Electro-Discharge Machining and its applications", IEEE, 1990, Y. F. Luo, C. G. Chen, Z. F. Tong "Investigation of silicon wafering by wire EDM", Journal of Materials Science 27 (1992) 58-05-5810, Dominiek Reynaerts et al. "Microstructuring of silicon electro-discharge machining (EDM) part I: theory" Elsevier Sciences (1997).

This type of configuration is illustrated in FIG. 2 and shows a heterostructure with:

- a first semiconductor structure comprising a standard substrate 10 made of non-intrinsically doped (NID) silicon, typically having a resistivity of 5 Ω.cm, comprising on its surface an active zone 11 of higher resistivity that may be comprised between 15 Ω.cm and 50 Ω.cm. Conventional thicknesses are also mentioned by way of example: 725 μm for the substrate 10 and 50 μm for the active layer 11;
- a thick metal structure 20 made of copper, possibly typically having a thickness of about 200 μm to 500 μm;
- a second semiconductor structure identical to the first semiconductor structure and comprising a standard substrate 30 made of non-intrinsically doped silicon, typically having a resistivity of 5 Ω.cm, on the surface of which an active zone 31 of higher resistivity, which may be comprised between 15 Ω.cm and 50 Ω.cm, is produced. Conventional thicknesses are also mentioned by way of example: 725 μm for the substrate 30 and 50 μm for the active layer 31.

In the context of many applications, the thickness of the semiconductor that is electrically active varies from a few nanometers in microelectronics (typically between 10 and 1000 nm) to a few microns in power electronics (typically between 1 and 100 μm) and also to a few microns in photovoltaics (typically between 10 and 75 μm). This active thickness of the semiconductor in question is generally subject to doping constraints: to improve mobility in the active semiconductor layers, dopants must be minimized, the semiconductor film is often either intrinsic or intentionally weakly doped. The semiconductor structure comprising the active layer of small thickness and the non-intrinsically doped substrate of larger thickness has a resistivity and therefore a state that is not compatible with the principle of EDM, in a standard configuration.

For this reason, the heterostructure to be cut proposed in the present invention is a heterostructure that is modified with respect to the heterostructure described above, so that said heterostructure is "seen", during EDM processing, to be a heterostructure that is conductive on the whole, thus allowing EDM cutting to be performed.

SUMMARY OF THE INVENTION

More precisely, one subject of the present invention is a process for fabricating at least one elementary heterostructure comprising:

producing a heterostructure comprising at least one semiconductor structure of resistivity higher than or equal to 1 Ω.cm located between two electrically conductive structures of resistivity lower than or equal to 0.1 Ω.cm, cutting said heterostructure by electrical discharge machining so as to define at least said elementary heterostructure;

the thickness of the semiconductor structure being smaller than about 1/10th of the thickness of at least one of said electrically conductive structures or of the total thickness of said electrically conductive structures.

According to variants of the invention, the electrically conductive structures are made of metal, possibly copper, or of alloy or of carbide or of graphite.

According to variants of the invention, the semiconductor structure is made of silicon or of germanium or of III-V material.

According to variants of the invention, the thickness of the semiconductor structure is about a few tens of microns, the thickness of at least one electrically conductive structure being at least several hundred microns.

According to variants of the invention, the process comprises producing the following heterostructure:

- a semiconductor layer possibly of silicon of resistivity lower than or equal to 10 mΩ.cm;
- a semiconductor layer possibly of silicon of resistivity higher than or equal to 1 Ω.cm;
- a metal layer;
- a semiconductor layer possibly of silicon of resistivity higher than or equal to 1 Ω.cm;
- a semiconductor layer possibly of silicon of resistivity lower than or equal to 10 mΩ.cm.

According to variants of the invention, the semiconductor layers possibly of silicon of resistivity lower than or equal to 10 mΩ.cm have thicknesses of about several hundred microns, the semiconductor layers possibly of silicon of resistivity higher than or equal to 1 Ω.cm having thicknesses of about a few tens of microns.

According to variants of the invention, the process comprises producing the following heterostructure:

- a metal layer;
- a semiconductor layer possibly of silicon of resistivity lower than or equal to 10 Ω.cm;
- a semiconductor layer possibly of silicon of resistivity higher than or equal to 1 Ω.cm;
- a metal layer;
- a semiconductor layer possibly of silicon of resistivity higher than or equal to 1 Ω.cm;
- a semiconductor layer possibly of silicon of resistivity lower than or equal to 10 mΩ.cm;
- a metal layer.

According to variants of the invention, the process comprises producing the following heterostructure:

- a metal layer;
- a semiconductor layer possibly of silicon of resistivity higher than or equal to 1 Ω.cm,
- a metal layer;
- a semiconductor layer possibly of silicon of resistivity higher than or equal to 1 Ω.cm,
- a metal layer.

According to variants of the invention, the production of the heterostructure comprises bonding said structures, said bonding possibly being achieved by thermo-compression. The heterostructure may also be produced by directly joining conductors (joint of solder/braze/weld type for example).

Another subject of the invention is the heterostructure obtained using the fabricating process of the invention.

Yet another subject of the invention is an electronic device comprising said heterostructure according to the invention and comprising at least one electronic component produced in the semiconductor layer of resistivity higher than or equal to 1 Ω.cm.

The electronic device may be a power electronic device in which the semiconductor layer has a resistivity comprised between about 15 Ω.cm and 50 Ω.cm, said device being a power electronic device.

BRIEF DESCRIPTION OF THE DRAWINGS

The invention will be better understood and other advantages will become apparent on reading the following non-limiting description, which is given with reference to the appended drawings, in which.

DETAILED DESCRIPTION

Figure 1:
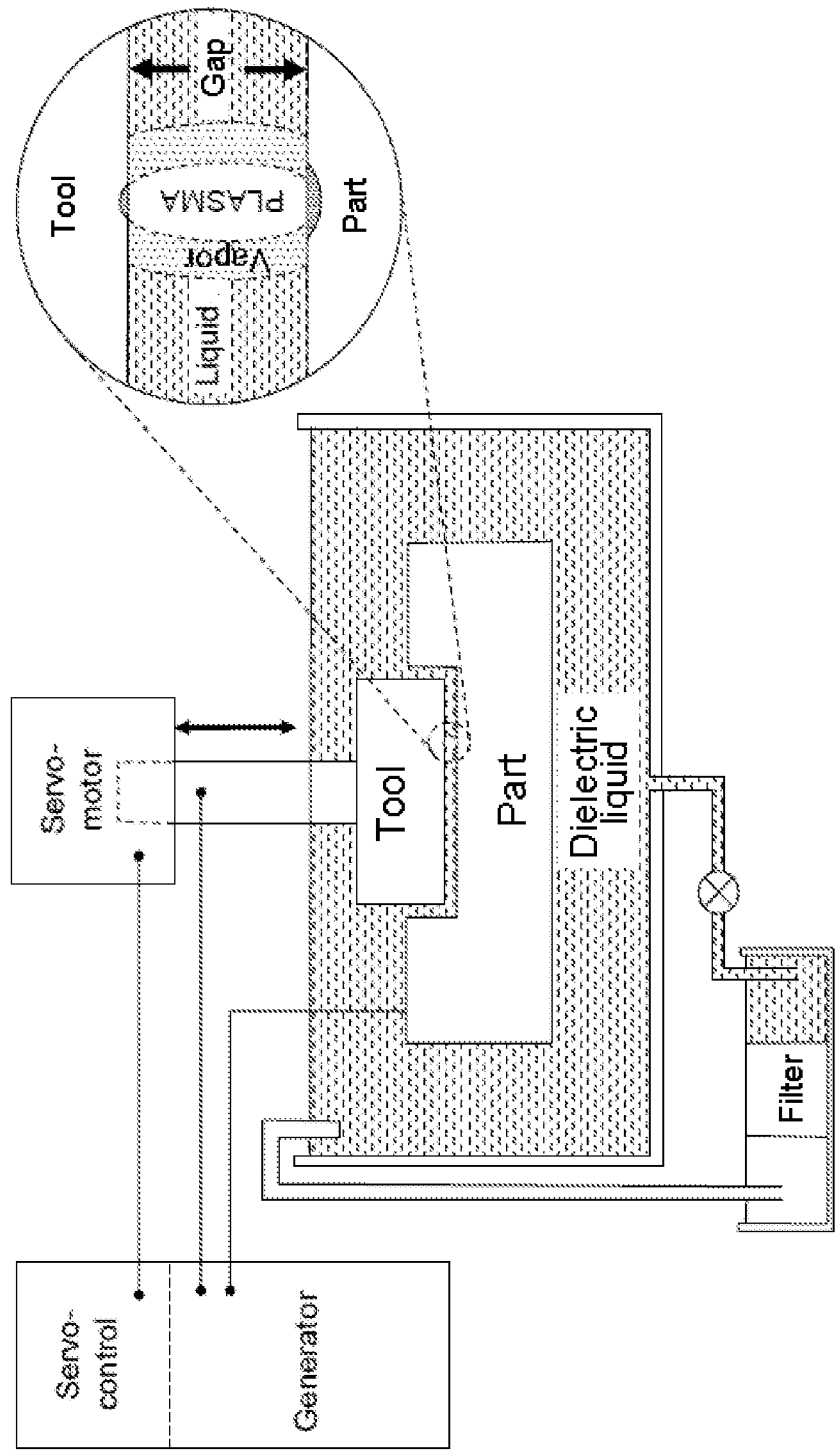
FIG. 1 illustrates the known principle of EDM of a part with a tool-electrode.

The fabricating process of the present invention allows elementary heterostructures to be defined from heterostructures of larger dimensions. This is in particular advantageous when defining centimeter-sized chips in standard microelectronic substrates or wafers, such as, non-restrictively, wafers possibly having a diameter typically of 100, 200, 300 mm.

Generally, the fabrication process of the present invention allows heterostructures of fragile materials, such as semiconductors, and of ductile materials, such as metals, to be cut, the constraint being that, to carry out an EDM cutting operation, the resistivity of the semiconductor structure of resistivity typically higher than 1 Ω.cm must not form a barrier to the operation.

To achieve this, the semiconductor structure must be located between two conductive structures. It may equally well be a question of a metal structure as of a semiconductor structure of a low resistivity, typically lower than 10 mΩ.cm. This semiconductor structure has a small thickness with respect to the thicknesses of the electrically conductive structures in their entirety.

First Example of an Elementary Heterostructure Obtained Using the Process of the Invention The following are assembled:
a first semiconductor substrate 100 of low resistivity lower than 10 mΩ.cm of a thickness possibly typically being equal to 725 μm performing a mechanical function, having on its surface a weakly doped semiconductor structure 101 of a high resistivity, possibly typically of about 20 Ω.cm, and of a thickness of about 50 μm;
a metal structure 200 possibly made of copper, having a thickness of about 300 μm to 500 μm;
a second semiconductor substrate 300 of a low resistivity lower than 10 mΩ.cm, of a thickness identical to that of the first substrate 100 and having on its surface a second semiconductor structure 301 of a high resistivity, possibly typically of about 20 Ω.cm, and of a thickness of about 50 μm and identical to the first semiconductor structure 101.

This assembly may thus be achieved by direct bonding at room temperature or by bonding by thermocompression (with application of a pressure and a temperature) or even more conventionally by soldering, brazing, etc.

Figure 3:
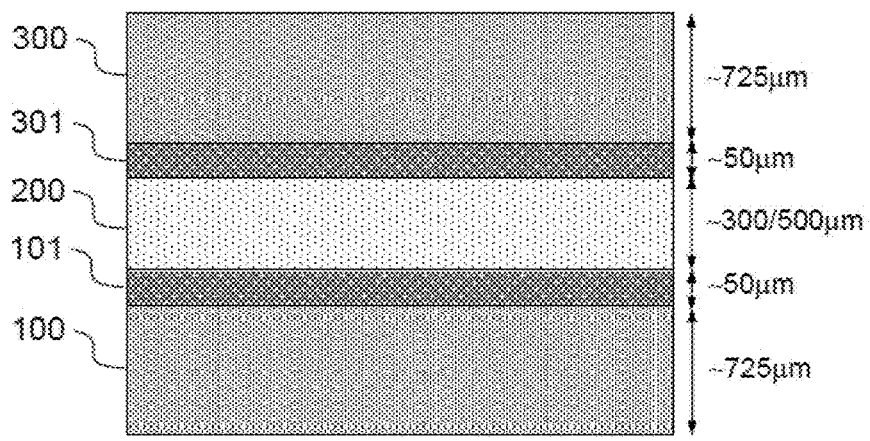
FIG. 3 illustrates a first example of a heterostructure able to be used in a process of the invention.

FIG. 3 illustrates such an assembly. Cutting of the assembly by EDM is made possible because of the integration of the semiconductor structures 101 and 301 between the electrically conductive structures 100 and 300 of resistivity lower than 10 mΩ.cm.

Figure 2:
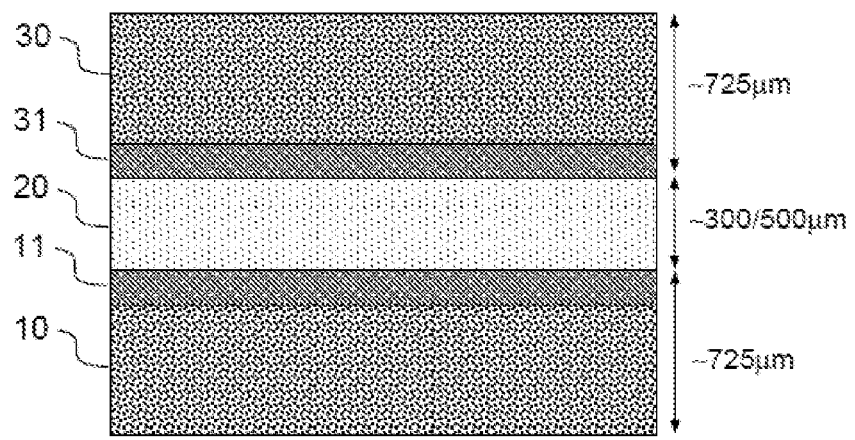
FIG. 2 illustrates a heterostructure comprising a standard Si substrate comprising a high-resistivity layer and a thick metal layer, this heterostructure not being able to be cut by EDM.
Figure 2:
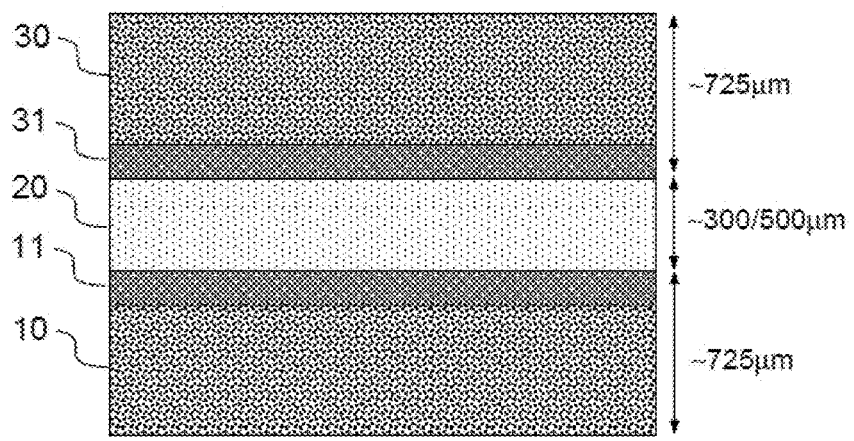

The Applicant has carried out cutting tests. It was not possible to cut the structure illustrated in FIG. 2 whereas in contrast it was possible to cut the heterostructure of the first example (FIG. 3) with a measured cutting speed of 10 mm/min. This speed makes industrial operations for cutting centimeter-sized chips entirely possible. Specifically, this speed is only three times lower than the cutting speed of a thick structure 200 made of copper.

Second Example of an Elementary Heterostructure Obtained Using the Process of the Invention The following are assembled:
a first metal structure 201 possibly made of copper, having a thickness of about 1 μm to 500 μm;
a first weakly doped semiconductor structure 101 of a high resistivity, possibly typically of about 20 Ω.cm, and of thickness of about 50 μm;
a second metal structure 200 possibly made of copper, having a thickness of about 300 μm to 500 μm;
a second weakly doped semiconductor structure 301 of a high resistivity, possibly typically of about 20 Ω.cm, and a thickness of about 50 μm;
a third metal structure 202 possibly made of copper, having a thickness of about 1 μm to 500 μm.

It will be noted that the top and bottom substrates may be very thin because they play no mechanical role (strength provided by the central substrate). It is therefore envisionable to form only a copper deposit instead of bonding a copper plate.

The thin weakly doped semiconductor layers forming the active portion are generally obtained by epitaxy from a standard NID substrate. After metal bonding between this active portion and a copper plate, a thinning operation carried out up to said active layer allows the inactive substrate to be removed.

It is then possible to deposit a copper layer (by CVD or PVD or even electrodeposition) or even to produce a second assembly with 2 copper plates one above and one below the preceding sandwich.

Figure 4:
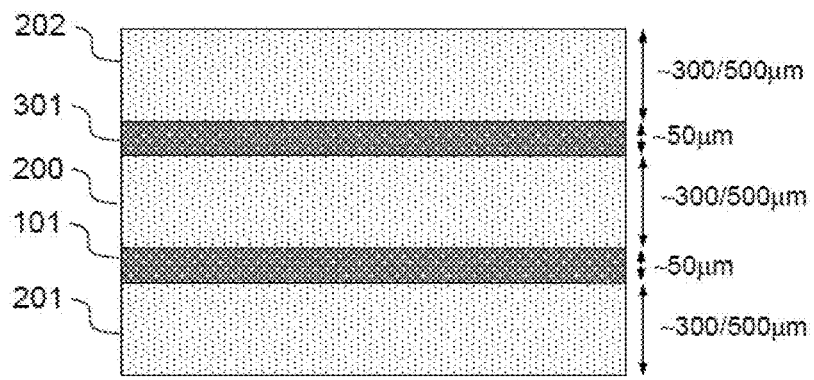
FIG. 4 illustrates a second example of a heterostructure able to be used in a process of the invention.

FIG. 4 illustrates such an assembly. Cutting of the assembly by EDM is made possible because of the integration of the semiconductor structures between two metal and therefore electrically conductive structures of resistivity lower than 1 Ω.cm.

The thicknesses of the layers 101 and 301 are sufficiently small with respect to the thicknesses of the metal layers 201/200/202 so that all of the heterostructure can be considered to be sufficiently conductive to allow an EDM cutting operation to be performed.

Third Example of an Elementary Heterostructure Obtained Using the Process of the Invention The following are assembled:
a first metal structure 201 possibly made of copper, of a thickness of about 1 μm to 500 μm;
a first semiconductor substrate 100 of low resistivity lower than 10 mΩ.cm of a thickness possibly typically being equal to 725 μm performing a mechanical function, having on its surface a weakly doped semiconductor structure 101 of a high resistivity, possibly typically of about 20 Ω.cm, and of a thickness of about 50 μm;
a second metal structure 200 possibly made of copper, having a thickness of about 300 μm to 500 μm;
a second semiconductor substrate 300 identical to the first substrate 100 (resistivity lower than or equal to 10 mΩ.cm) and having on its surface a second semiconductor structure 301 of a high resistivity, possibly typically of about 20 Ω.cm, and of a thickness of about 50 μm and identical to the first semiconductor structure 101;
a third metal structure 202 possibly made of copper, having a thickness of about 1 μm to 500 μm.

Figure 5:
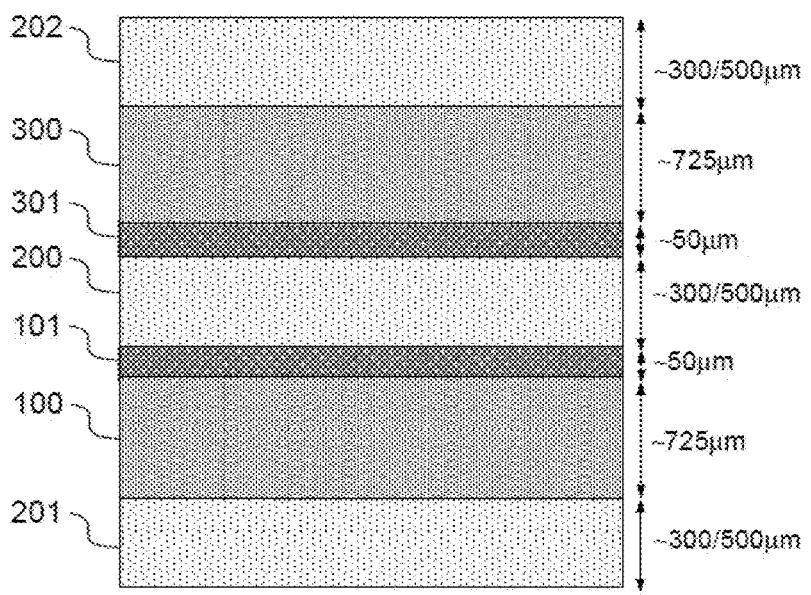
FIG. 5 illustrates a third example of a heterostructure able to be used in a process of the invention.

FIG. 5 illustrates such an assembly. Cutting of the assembly by EDM is made possible because of the integration of the semiconductor structures between a metal structure and an electrically conductive structure of resistivity lower than or equal to 10 mΩ.cm.

Fourth Example of an Elementary Heterostructure Obtained Using the Process of the Invention This heterostructure comprises a semiconductor substrate 100 of low resistivity lower than or equal to 10 mΩ.cm of a thickness possibly typically being equal to 725 μm performing a mechanical function, having on its surface a weakly doped semiconductor structure 101 of a high resistivity, possibly typically of about 20 Ω.cm, and of a thickness of about 50 μm, and two very thin metal layers 201 and 202 made of copper, typically of a thickness of 200 nm.

These very thin metal layers improve the ohmic contact during the EDM cutting operation, and tests carried out by the Applicant on this heterostructure with success clearly show that it becomes possible to EDM a silicon substrate (that is weakly resistive, typically of a resistivity lower than or equal to 10 mΩ.cm) comprising a thin weakly doped and very resistant active layer of silicon, a standard NID substrate having been replaced by such a silicon substrate.

Figure 6:
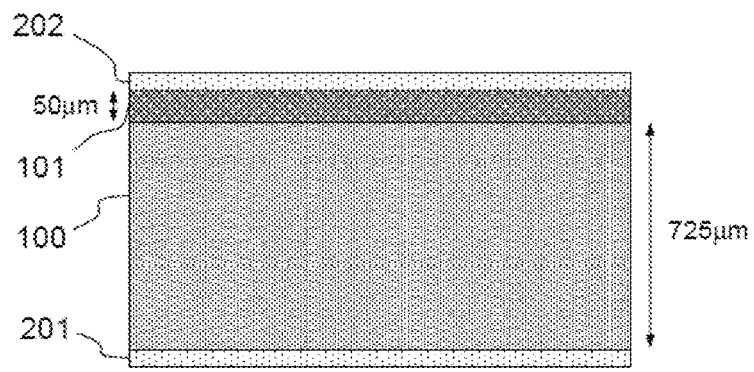
FIG. 6 illustrates a fourth example of a heterostructure able to be used in a process of the invention.

FIG. 6 illustrates such an assembly. Cutting of the assembly by EDM is made possible because of the integration of the semiconductor structures between a metal structure and an electrically conductive structure of resistivity lower than 1 Ω.cm.

The cutting tests carried out by the Applicant have led it to be believed that the thickness of the (highly resistive) active zone must remain small with respect to the thickness of the electrically conductive structure. Typically a ratio of 10 allows the EDM cutting operation to be performed. Specifically, the electric arc is formed and therefore the material melted through the weakly resistive layers, and it is by thermal conduction that the thin more highly resistive structure melts and may be machined.

These EDM cutting tests were carried out with an AGIE, PROGRESS V2 machine with the control software AGIEVISION CUT. This machine exploits the EDM technique that uses as tool-electrode a metal wire.

Figure 7A:
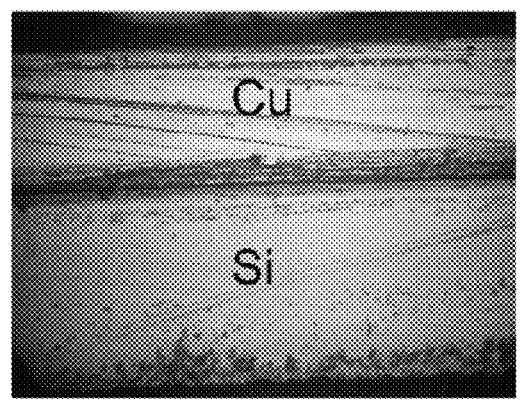
FIGS. 7a and 7b are micrographs of silicon-copper heterostructures cut by sawing and by EDM, respectively.
Figure 7B:
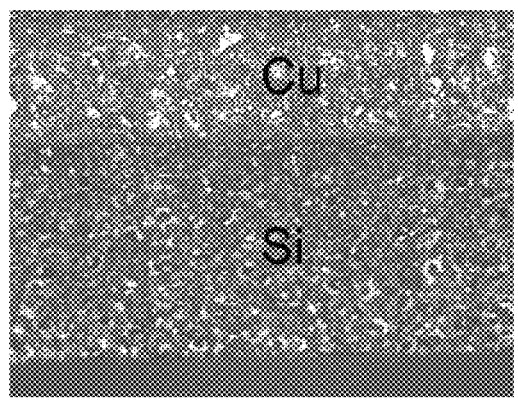

Observing the elementary heterostructures obtained after cutting under a microscope allow the trace of the type of cutting operation employed to be observed. By way of indication, FIGS. 7*a* and 7*b* show a micrograph of an Si/Cu heterostructure cut by sawing and a micrograph of an Si/Cu heterostructure cut by EDM, respectively.

To determine whether a cut was made by sawing or by EDM, it is enough to observe the surface finish of the cut wall. EDM melts the material, causing the appearance of "droplets" on the cut edge face. Sawing is solely mechanical and causes the appearance of striations/scratches.

The invention claimed is:

1. A process for fabricating at least one elementary heterostructure comprising:
producing a heterostructure comprising at least one semiconductor structure of resistivity higher than or equal to 1 Ω.cm located between two electrically conductive structures of resistivity lower than or equal to 0.1 Ω.cm;
cutting said heterostructure by electrical discharge machining so as to define at least said elementary heterostructure;
the thickness of the semiconductor structure being smaller than about 1/10th of the thickness of at least one of said electrically conductive structures or of the total thickness of said electrically conductive structures.

2. The fabricating process as claimed in claim 1, wherein the electrically conductive structures are made of metal or of alloy or of carbide or of graphite.

3. The fabricating process as claimed in claim 2, wherein the process comprises producing the following heterostructure:
a metal layer;
a semiconductor layer of resistivity higher than or equal to 1 Ω.cm;
a metal layer;
a semiconductor layer of resistivity higher than or equal to 1 Ω.cm; and
a metal layer.

4. The fabricating process as claimed in claim 2, wherein the process comprises producing the following heterostructure:
a metal layer;
a semiconductor layer of silicon of resistivity higher than or equal to 1 Ω.cm;
a metal layer;
a semiconductor layer of silicon of resistivity higher than or equal to 1 Ω.cm; and
a metal layer.

5. The fabricating process as claimed in claim 1, wherein the semiconductor structure is made of silicon or of germanium or of III-V material.

6. The fabricating process as claimed in claim 5, wherein the process comprises producing the following heterostructure:
a semiconductor layer of resistivity lower than or equal to 10 mΩ.cm;
a semiconductor layer of resistivity higher than or equal to 1 Ω.cm;

a metal layer;
a semiconductor layer of resistivity higher than or equal to 1 Ω.cm; and
a semiconductor layer of resistivity lower than or equal to 10 mΩ.cm.

7. The fabricating process as claimed in claim 6, wherein the semiconductor layers of resistivity lower than or equal to 10 mΩ.cm have thicknesses of about several hundred microns, the semiconductor layers of resistivity higher than or equal to 1 Ω.cm having thicknesses of about a few tens of microns.

8. The fabricating process as claimed in claim 5, wherein the process comprises producing the following heterostructure:
   a metal layer;
   a semiconductor layer of resistivity lower than or equal to 10 Ω.cm;
   a semiconductor layer of resistivity higher than or equal to 1 Ω.cm;
   a metal layer;
   a semiconductor layer of resistivity higher than or equal to 1 Ω.cm;
   a semiconductor layer of resistivity lower than or equal to 10 mΩ.cm; and
   a metal layer.

9. The fabricating process as claimed in claim 5, wherein the thickness of the semiconductor structure is about a few tens of microns, the thickness of at least one electrically conductive structure being at least several hundred microns.

10. The fabricating process as claimed in claim 5, wherein the process comprises producing the following heterostructure:
    a semiconductor layer of silicon of resistivity lower than or equal to 10 mΩ.cm;
    a semiconductor layer of silicon of resistivity higher than or equal to 1 Ω.cm;
    a metal layer;
    a semiconductor layer of silicon of resistivity higher than or equal to 1 Ω.cm; and
    a semiconductor layer of silicon of resistivity lower than or equal to 10 mΩ.cm.

11. The fabricating process as claimed in claim 5, wherein the processes comprises producing the following heterostructure:
    a metal layer;
    a semiconductor layer of silicon of resistivity lower than or equal to 10 Ω.cm;
    a semiconductor layer of silicon of resistivity higher than or equal to 1 Ω.cm;
    a metal layer; and
    a semiconductor layer of silicon of resistivity higher than or equal to 1 Ω.cm;
    a semiconductor layer of silicon of resistivity lower than or equal to 10 mΩ.cm;
    a metal layer.

12. The fabricating process as claimed in claim 1, wherein the production of the heterostructure comprises bonding said electrically conductive and semiconductor structures, said bonding being achieved by thermo-compression.

13. An elementary heterostructure obtained using the process as claimed in claim 1.

14. An electronic device comprising a heterostructure as claimed in claim 13 and comprising at least one electronic component produced in the semiconductor layer of resistivity higher than or equal to 1 Ω.cm.

15. The electronic device as claimed in claim 14, wherein the semiconductor structure has a resistivity comprised between about 15 Ω.cm and 50 Ω.cm, said device being a power electronic device.

16. The fabricating process as claimed in claim 1, wherein the electrically conductive structures are made of copper.

* * * * *